US007216249B2

(12) United States Patent
Fujiwara et al.

(10) Patent No.: US 7,216,249 B2
(45) Date of Patent: May 8, 2007

(54) CLOCK GENERATION SYSTEM

(75) Inventors: Masayu Fujiwara, Kyoto (JP); Masaki Onishi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 581 days.

(21) Appl. No.: 10/457,149

(22) Filed: Jun. 9, 2003

(65) Prior Publication Data

US 2003/0229815 A1   Dec. 11, 2003

(30) Foreign Application Priority Data

Jun. 11, 2002 (JP) ............................. 2002-169828
Apr. 21, 2003 (JP) ............................. 2003-115774

(51) Int. Cl.
| | |
|---|---|
| G06F 1/04 | (2006.01) |
| G06F 1/06 | (2006.01) |
| G06F 1/10 | (2006.01) |
| H03L 7/16 | (2006.01) |
| H03L 7/18 | (2006.01) |
| H03B 19/12 | (2006.01) |
| H03K 3/03 | (2006.01) |
| H03K 21/00 | (2006.01) |
| H03K 23/00 | (2006.01) |

(52) U.S. Cl. ................... 713/501; 713/500; 713/502; 713/503; 713/600; 327/141; 327/144; 327/147; 327/156; 331/2; 331/46; 331/51

(58) Field of Classification Search ............... None
See application file for complete search history.

(56) References Cited

U.S. PATENT DOCUMENTS

| 6,111,712 A | * | 8/2000 | Vishakhadatta et al. ....... 360/51 |
| 6,118,316 A | * | 9/2000 | Tamamura et al. ......... 327/156 |
| 6,566,921 B1 | * | 5/2003 | Boerstler et al. ........... 327/156 |
| 6,703,876 B2 | * | 3/2004 | Fujiwara et al. ............ 327/156 |

* cited by examiner

*Primary Examiner*—James K. Trujillo
(74) *Attorney, Agent, or Firm*—Hogan & Hartson LLP

(57) ABSTRACT

A clock generation system for generating a first-, a second-, and a third-reference frequency clocks having respective frequencies having predetermined ratios to the reference frequency of a reference clock, using PL circuits in such a way that the clocks have sufficient S/N ratios in spite of the S/N ratio limitation by the noise floor. A first reference frequency clock is supplied to a first PLL circuit to generate an intermediate-frequency clock having an intermediate frequency having a predetermined ratio to the reference clock. The intermediate-frequency clock is supplied to a second and a third PLL circuits to generate a second and a third reference frequency clocks having frequencies respectively having a second and a third ratios to the intermediate frequency, respectively.

11 Claims, 7 Drawing Sheets

FIG. 6

| OUTPUT CLOCKS | | 27 MHz REF. FREQ. CLOCK REF. (FIG. 7) | 27 MHz REF. FREQ. CLOCK 1 FIG. 1 | 33.8688 MHz REF. FREQ. CLOCK 2 FIG. 2 | 36.864 MHz REF. FREQ. CLOCK 3 FIG. 3 | 34.560 MHz REF. FREQ. CLOCK 4 FIG. 4 | 27 MHz REF. FREQ. CLOCK 2 FIG. 5 |
|---|---|---|---|---|---|---|---|
| 54MHz | FOR VIDEO | NO OUTPUT | NO OUTPUT | 63.1dB | 62.1dB | 62.1dB | 72.0dB |
| 27MHz | FOR VIDEO | 80dB | 80dB | 69.1dB | 68.1dB | 68.1dB | 80.0dB |
| 13.5MHz | FOR VIDEO | 86dB | 86dB | 75.1dB | 74.1dB | 74.1dB | 86.0dB |
| 36.864MHz | 48K : 768fs 32K : 1152fs | 36.0dB | 59.4dB | 60.0dB | 80dB | 66.0dB | 54.0dB |
| 24.576MHz | 48K : 512fs 32K : 768fs | 39.5dB | 63.0dB | 63.5dB | NO OUTPUT | 69.5dB | 57.5dB |
| 18.432MHz | 48K : 384fs 32K : 576fs | 42.0dB | 65.4dB | 66.0dB | 86dB | 72.0dB | 60.0dB |
| 12.288MHz | 48K : 256fs 32K : 384fs | 45.5dB | 69.0dB | 69.5dB | NO OUTPUT* | 75.5dB | 63.5dB |
| 33.8688MHz | 44.1K : 768fs | 32.3dB | 60.2dB | 80dB | 62.3dB | 62.3dB | 50.3dB |
| 22.5792MHz | 44.1K : 512fs | 35.8dB | 63.7dB | NO OUTPUT | 65.8dB | 65.8dB | 53.8dB |
| 16.9344MHz | 44.1K : 384fs | 38.3dB | 66.2dB | 86dB | 68.3dB | 68.3dB | 56.3dB |
| 11.2896MHz | 44.1K : 256fs | 41.8dB | 69.7dB | NO OUTPUT* | 71.8dB | 71.8dB | 59.8dB |

CLOCK GENERATION SYSTEM

FIELD OF THE INVENTION

The invention relates to a clock generation system for generating from a given frequency clock a first-reference frequency clock, a second-reference frequency clock, and a third-reference frequency clock respectively having frequencies having predetermined ratios to the frequency of the given clock. More particularly, the invention relates to a clock generation system suitable for generating a multiplicity of clocks having reference frequencies required by a DVD (Digital Versatile Disc) system.

BACKGROUND OF THE INVENTION

In the art of DVD system that utilizes, for example, a DVD player, a DVD-R, and a DVD-RW, it is necessary to provide a multiplicity of clocks of different reference frequencies (referred to as reference frequency clocks), including at least a 27 MHz clock series (first reference frequency series) for a video system, a 33.8688 MHz clock series (second reference frequency series) for a sound system (particularly CD) (the series including integral multiples of a sampling frequency of 44.1 kHZ), and a 36.864 kHz clock series (third reference frequency series) for another sound system (particularly DVD) (the series including integral multiples of 48 kHz and 32 kHz sampling frequencies).

These three reference frequency series can be obtained using individual oscillation modules. However, this approach is costly for a clock generation system because it requires one oscillation module for each of the required reference clock frequencies. Then, in order to reduce the cost, one might consider to generate two of the three reference frequency series from the remaining one, utilizing PLL (phase-locked loop) circuits, as shown in FIG. 7. FIG. 7 shows a clock generation system conjectured by the inventor in the process of devising the present invention, which is shown as a reference, but not prior art.

In the system shown in FIG. 7, a first reference frequency clock Fr1 (27 MHz) generated by an oscillation module is used as the basis for generating the remaining two reference frequency clocks, that is a second reference frequency clock Fr2 (33.8688 MHz) and a third reference frequency clock Fr3 (36.864 MHz).

In the first PLL circuit 70a as shown in FIG. 7, the first 27 MHz reference frequency clock Fr1 is supplied to a first frequency divider 71a, which frequency-divides the input first clock by a factor of 625 and supplies it to one comparison input terminal P1 of a phase comparator (PD) 73a. The second frequency divider 72a receives the output of the PLL circuit 70a and frequency-divides it by a factor of 3136, which is supplied to a PD 73a as another comparison input P2. The PD 73a compares the two inputs P1 and P2 and generates an output (referred to as comparison output) indicative of the phase difference between them. The comparison output is smoothed by a low-pass filter (LPF) before it is supplied to a voltage control oscillator (VCO) 75a as a control signal. The VCO 75a changes its oscillation frequency according to the control signal input so that the two inputs to the PD 73a coincide in frequency and in phase. The loop gain of this PLL circuit is large, so that remaining deviation is extremely small. Thus, the frequency of the output of the VCO 75a is converted to 135.4752 (=27×3136/625) MHz, in accordance with the frequency division ratio of the frequency dividers 71a and 72a.

The output frequency of the VCO 75a is frequency-divided by a frequency divider 76a by a factor of 4, generating a second reference frequency clock Fr2. The output frequency of the VCO 75a is further frequency-divided by a 1/6 frequency divider 77a, a 1/8 frequency divider 78a, and a 1/12 frequency divider 79a, respectively, into 22.5792 MHz, 16.9344 MHz, and 11.2896 MHz. These frequencies have specific relationships with the second reference frequency clock Fr2. These clocks belonging to the second reference frequency series have integral multiple of the sampling frequency of 44.1 kHz for use with CD systems.

The second PLL circuit 70b also performs frequency division similar to that of the first PLL circuit 70a, except that the frequency division ratio of the first frequency divider 71b is 1/375, while that of the second frequency divider 72b is 1/2048. The output frequency of the VCO 75b is converted into 147.456(=27×2048/375) MHz in accordance with the division ratios of the frequency dividers 71b and 72b. Incidentally, reference numeral 73b indicates a PD, and 74b indicates an LPF.

The output frequency of the VCO 75b is frequency-divided by the frequency divider 76b by a factor of 4 to produce a third reference frequency clock Fr3. Additionally, the output frequency of the VCO 75b is frequency-divided by a 1/6 frequency divider 77b, a 1/8 frequency divider 78b, and a 1/12 frequency divider 79b to generate frequencies of 24.576 MHz, 18.432 MHz, and 12.288 MHz, respectively, which have specific frequency relationship with the third reference frequency clock Fr3. The frequencies of these clocks belonging to the third reference frequency series Fr3s are integral multiples of audio sampling frequencies 48 kHz and 32 kHz in DVD systems.

Clocks of a first reference frequency series Fr1s are also generated. The series includes the first reference frequency clock Fr1 (27 MHz) and a clock of 13.5 MHz obtained by frequency division of the first reference frequency clock Fr1 by a 1/2 frequency divider 76d.

Thus, one may choose necessary frequency clocks from the first through third reference frequency series Fr1s–Fr3s for his use.

The S/N (signal-to-noise) ratios of the clocks generated by the clock generation system shown in FIG. 7 can be obtained based on a known S/N theory as follows. As an example, S/N ratio of clocks of the second reference frequency series Fr2s will be discussed. It will be understood that by the frequency division of the first reference frequency clock Fr1 by a factor of 625, the S/N ratio is improved by 20 log 625 [dB]. Hence, theoretically, the S/N ratio of the output signal of the first frequency divider 71a equals (S/N ratio of the output signal+20 log 625) [dB]. Assuming that the S/N ratio of the first reference frequency clock is 80 [dB], it is 80+56=136 [dB]. Note that the S/N ratios are rounded to integers for simplicity. (It is also the case in the following discussion.)

It should be noted, however, that since a PLL circuit is in operation on the noise floor of a given IC (integrated circuit) on which the PLL circuit is formed, the S/N ratio of the PLL circuit is limited by the S/N ratio of the noise floor. The S/N ratio of the noise floor is governed by the fluctuations in the power supply potential, which is on the order of 90 [dB]. Hence, the S/N ratio of the PLL circuit is limited by the S/N ratio of the noise floor (90 [dB]). Hence, the S/N ratio of the output of the first frequency divider 71a, that is, the S/N ratio of one comparison input P1 to the PD 73a is at most 90 [dB].

Since the S/N ratios of the comparison inputs P1 and P2 to the PD 71a are the same, the S/N ratio of the comparison input P2 is 90 [dB]. The S/N ratio of the comparison input to the second frequency divider 72a is lowered by 20log3136 [dB], since the input P2 is stepped up by a factor of 3136. Therefore, the S/N ratio of the input to the second frequency divider 72a becomes (90 (for the comparison input P2) −20log3136) [dB], or 20.3 [dB].

Thus, S/N ratios of clocks of the second reference frequency series Fr2s are 32.3 [dB] for the second reference frequency clock Fr2, 35.8 [dB] for the 22.5792 MHz clock, 38.3 [dB] for the 16.9344 MHz clock, and 41.8 [dB] for the 11.2896 MHz clock.

Similar calculations lead to S/N ratios of the clocks of the third reference frequency series Fr3s. They are: 36.0 [dB] for the third reference frequency clock Fr3; 39.5 [dB] for 24.576 MHz clock; 42.0 [dB] for 18.432 MHz clock; and 45.5 [dB] for 12.288 MHz clock.

In this way, using PLL circuits and frequency dividers as shown in FIG. 7, it is possible to generate clocks of a second reference frequency series Fr2s which include a second reference frequency clock Fr2 obtained by multiplying the frequency of the first reference frequency clock Fr1 by a predetermined ratio, and clocks of a third reference frequency series Fr3s which include a third reference frequency clock Fr3 obtained by a similar multiplication. However, the S/N ratios of the clocks of the second and third reference frequency series are lowered to 30 [dB] −40 [dB]. This deterioration in S/N ratio is a problem that must be solved, since DVD systems, etc. in general requires a S/N ratio of at least 50 [dB], preferably more than 60 [dB].

SUMMARY OF THE INVENTION

It is, therefore, an object of the invention to provide a clock generation system for generating a multiplicity of reference frequency clocks needed in DVD systems, which include clocks of a first reference frequency series (27 MHz series) for use in video system, a second reference frequency series (33.8588 MHz series) for use in audio system (particularly in CD), and a third reference frequency series (36.864 MHz series) for use in audio system (particularly in DVD), using a least number of oscillation modules and additional PLL circuits, the clock generation system capable of providing the first through the third clocks having sufficient S/N ratios in spite of the S/N ratio limitation by the noise floor.

In accordance with an aspect of the invention, there is provided a clock generation system for generating at least a clock having a first frequency (referred to as first-frequency clock), a clock having a second frequency (referred to as second-frequency clock), and a clock having a third frequency (referred to as third-frequency clock), comprising:

a first PLL circuit supplied with the first-frequency clock as a reference clock and adapted to generate a clock with an intermediate frequency (referred as intermediate-frequency clock) having a predetermined first ratio to the reference frequency;

a second PLL circuit supplied with the intermediate-frequency clock and adapted to generate the second-frequency clock, with the second frequency having a predetermined second ratio to the intermediate frequency; and a third PLL circuit supplied with the intermediate-frequency clock and adapted to generate the third-frequency clock, with the third frequency having a predetermined third ratio to the intermediate frequency.

In accordance with another aspect of the invention, there is provided a clock generation system for generating at least a clock having a first frequency (referred to as first-frequency clock), a clock having a second frequency (referred to as second-frequency clock), and a clock having a third frequency (referred to as third-frequency clock), comprising:

a first PLL circuit supplied with a reference clock and adapted to generate an intermediate-frequency clock having an intermediate frequency which is a predetermined first ratio to the reference frequency;

a second PLL circuit supplied with the intermediate-frequency clock and adapted to generate the second-frequency clock, with the second frequency having a predetermined second ratio to the intermediate frequency; and a third PLL circuit supplied with the intermediate-frequency clock and adapted to generate the third-frequency clock, with the third frequency having a predetermined third ratio to the intermediate frequency.

In accordance with a further aspect of the invention, there is provided clock generation system for generating at least a first-frequency clock having a first frequency, a second-frequency clock having a second frequency, a third-frequency clock having a third frequency, and a fourth-frequency clock having a frequency that is double of the first frequency, the clock generation system comprising:

a first PLL circuit supplied with the first-frequency clock as a reference clock and adapted to generate an intermediate-frequency clock having an intermediate frequency having a predetermined first ratio to the reference frequency;

a frequency divider for frequency dividing the first-frequency by a predetermined factor to generate the fourth frequency;

a second PLL circuit supplied with the intermediate-frequency clock and adapted to generate the second-frequency clock, with the second frequency having a predetermined second ratio to the intermediate frequency; and a third PLL circuit supplied with the intermediate-frequency clock and adapted to generate the third-frequency clock, with the third frequency having a predetermined third ratio to the intermediate frequency.

In view of the fact that the S/N ratios of the PLL circuits are improved according to the frequency division ratio and lowered according to the multiplication ratio, and that it is limited by the S/N ratio of the noise floor, the invention generates a common intermediate-frequency clock in the first PLL circuit and the intermediate-frequency clock is supplied to the second and the third PLL circuits. This permits elimination of the limitation, or reduction of the influence, of the noise floor on the S/N ratio. Thus, in spite of the noise floor limitation on the S/N ratios, a second and a third-frequency clocks can be generated from a first-frequency clock with sufficient S/N ratios.

Furthermore, the inventive clock generation system can generate a first 27 MHz reference clock series for a video system, a second 33.8688 MHz reference clock series for a sound system (particularly for CD) (with the frequencies being integral multiples of a 44.1 kHz sampling frequency), and a third 36.864 kHz reference clock series for another sound system (particularly for DVD) (with the frequencies being integral multiples of 48 kHz and 32 kHz sampling frequencies), all with sufficient S/N ratios.

The use of a common reference clock adequate for the first through third-frequency clocks eliminates the limitation or minimizes the influence of the noise floor, thereby allowing generation of the first through the third-frequency clocks having sufficient S/N ratios.

The invention also permits generation of a fourth frequency clock whose clock frequency is double the frequency of the first-frequency clock (used as a reference frequency clock) from the clock outputted from the first PLL circuit as a common intermediate-frequency clock for the second and the third PLL circuits.

BRIEF DESCRIPTION OF THE DRAWINGS

FIG. 6 is a table showing the clocks of the respective frequency series along with the S/N ratios involved.

DETAILED DESCRIPTION OF THE PREFERRED EMBODIMENT

The invention will now be described in detail by way of examples with reference to the accompanying drawings.

Figure 1:
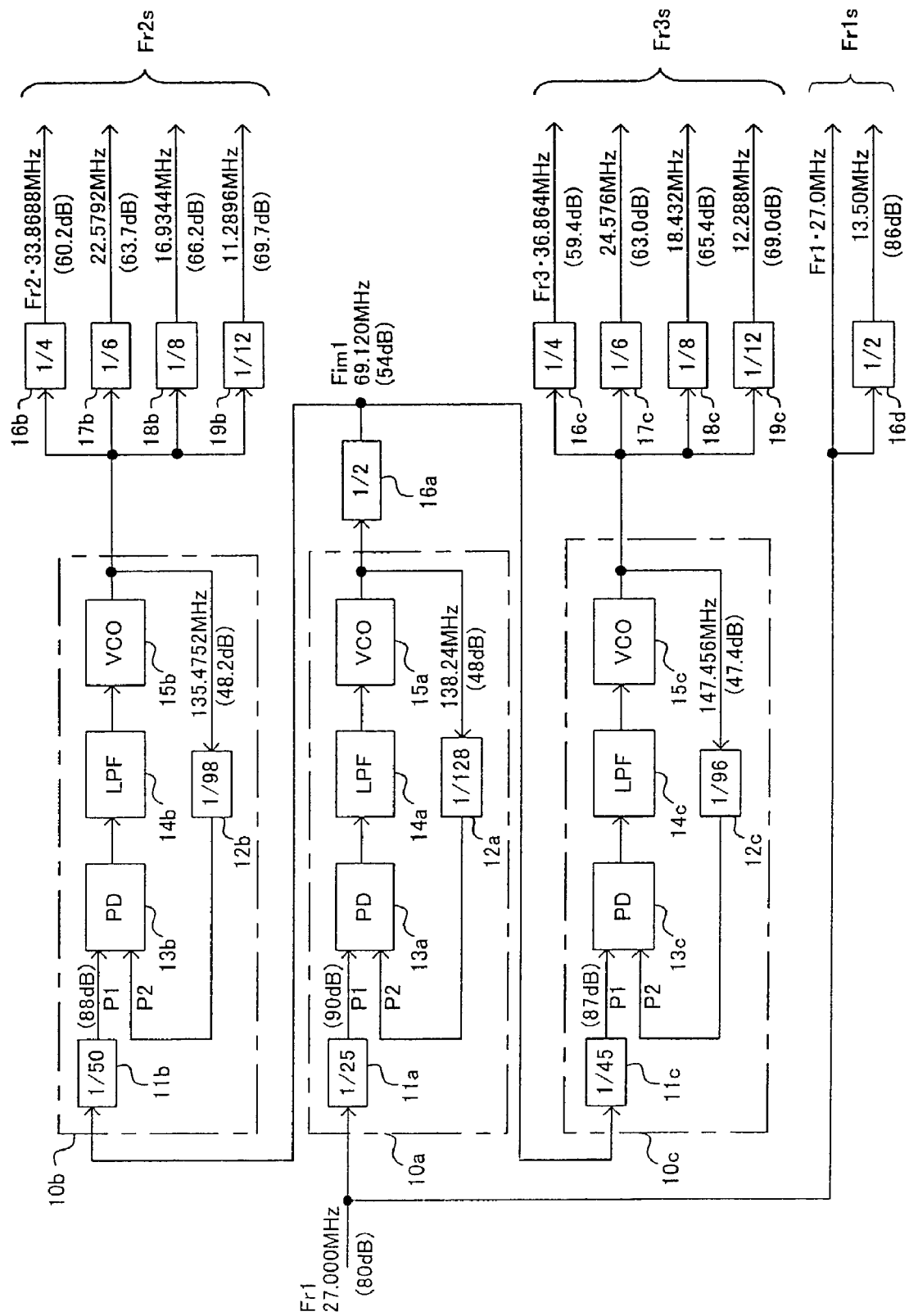
FIG. 1 is a block diagram representation of a first embodiment of a clock generation system according to the invention.

Referring to FIG. 1, there is shown in block diagram a first embodiment of a clock generation system according to the invention. This clock generation system is designed to receive as a reference clock a first reference frequency clock of 27 MHz for use in a video system to generate clocks of a first frequency series (or 27 MHz series) for video system, a second reference frequency series (or 33.8688 MHz series) for audio system (particularly for CD), and a third reference frequency series (or 36.864 MHz series) for audio system (particularly for DVD).

In view of the fact that the S/N ratio of a PLL circuit gets improved by the frequency division ratio thereof, lowered by the multiplication ratio, and limited by the S/N ratio of the noise floor, a first-frequency clock Fr1 is supplied as the reference clock to a first PLL circuit 10a, which generates an intermediate-frequency clock Fim1 having a frequency as determined by the first reference frequency clock Fr1 and a first predetermined ratio.

The intermediate-frequency clock Fim1 is entered in a second PLL circuit 10b, which generates a second-base clock) for generating a second reference clock having a frequency as determined by the intermediate-frequency clock Fim1 and a second predetermined ratio. The second-base clock is frequency-divided to generate clocks of a second reference frequency series Fr2s that includes the frequency of the second reference frequency clock Fr2.

The intermediate-frequency clock Fim1 is also supplied to a third PLL circuit 10c, which generates a third-base clock) for generating a third reference clock having a frequency as determined by the intermediate-frequency clock Fim1 and a third predetermined ratio. The frequency of the third-base is frequency-divided to generate a third reference frequency series Fr3s that includes the frequency of the third reference clock Fr3.

In this way, a multiplicity of PLL circuits are connected in series, wherein a common intermediate-frequency clock Fim1 is generated by the first stage PLL circuit 10a, which is supplied to the second and third PLL circuits to distribute frequency division ratios among the PLL circuits. This helps to circumvent the limitation or suppress the influence of the noise floor on the S/N ratios of the clocks generated.

The clock system of FIG. 1 is formed on an IC. The first reference frequency clock Fr1 for use as the reference clock may be generated by an internal oscillation module provided in the IC, or may be supplied from an external IC.

The first PLL circuit 10a is supplied with the first reference frequency clock Fr1 (27 MHz). Here, it is assumed that the S/N ratio of this clock Fr1 is 80 [dB], and S/N ratio of the noise floor is 90 [dB], as in the example shown in FIG. 7.

In the first PLL circuit 10a, a first frequency divider 11a frequency-divides the clock Fr1 by 25, and feed the divided clock to one comparison input P1 of a PD 13a. The S/N ratio of this comparison input P1 is theoretically 108 [dB] (=80+20log25), but on account of the limitation of the noise floor, the S/N ratio drops to 90 [dB]. A second frequency divider 12a frequency-divides the output of the first PLL circuit 10a by 128, and supplies the resultant clock to another comparison input P2 of the PD 13a. The S/N ratio of the comparison input P2 turns out to be 90 [dB].

Figure 7:
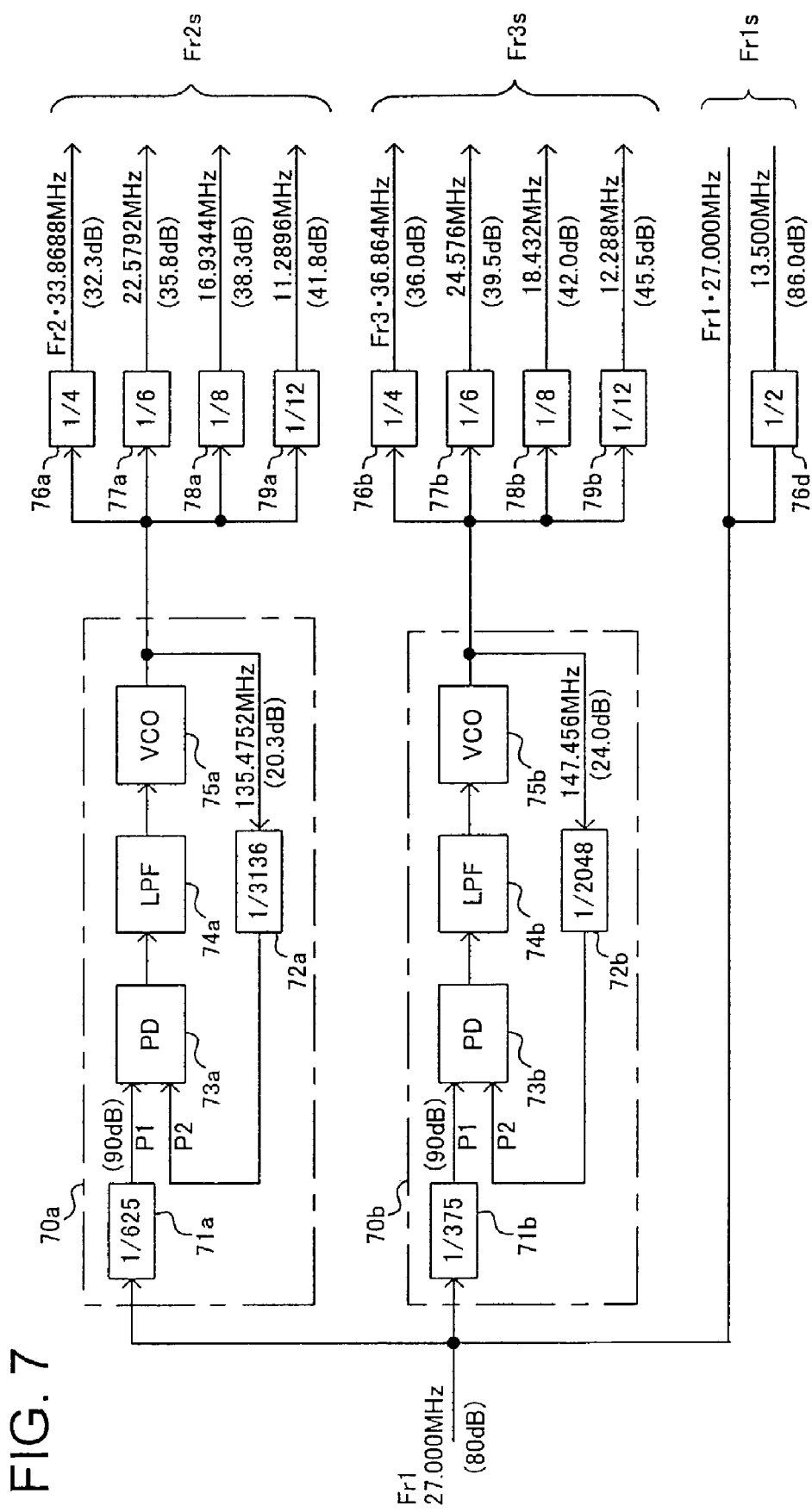
FIG. 7 is a block diagram of an exemplary clock generation system.

PD 13a, LPF 14a, and VCO 15a of the first PLL circuit 10a only differ from corresponding circuits of PLL circuits shown in FIG. 7 in that some of their parameters are different, and these PLL circuits operate in the same manner. The frequency of the output of the VCO 15a is converted to 138.24 (=27×128/25) MHz in accord with the frequency division ratio of frequency dividers 11a and 12a. The S/N ratio of the output of the VCO 15a is 48 [dB] (=90−20 log 128). The output of the VCO 15a is further frequency-divided by a frequency divider 16a by the ratio of 1/2, resulting in a first intermediate-frequency clock Fim1 (69.120 MHz). As a consequence of the frequency division (by 2) by the frequency divider 16a, the S/N ratio of this clock Fim1 becomes 54 [dB].

This clock Fim1 (69.120 MHz, 54 [dB]) are utilized as a common input clock to the second PLL circuit 10b and the third PLL circuit 10c.

The second PLL circuit 10b is composed of a first frequency divider 11b (division ratio of 1/50), a second frequency divider 12b (division ratio 1/98), a PD 13b, an LPF 14b, and a VCO 15b. Although the division ratios are different, the second PLL circuit operates in the same way as the first PLL circuit 10a.

The second PLL circuit 10b is supplied with the clock Fim1, generating a second-base clock of 135.4752 MHz (=69.120×98/50) in accord with the division ratios of the frequency dividers 11b and 12b.

The S/N ratio of the output of the first frequency divider 11b, i.e. the first input P1 to the PD 13b, is not limited by the noise floor, and becomes 88 [dB] (=54+20log50). The S/N ratio of the input to the second frequency divider 12b, i.e. the S/N ratio of the second-base clock, becomes 48.2 [dB] (=88−20 log 98).

This second-base clock (135.4752 MHz, 48.2 [dB]) is again frequency-divided by 4 by a frequency divider 16b, resulting in a second reference frequency clock Fr2 (33.8688 MHz, 60.2 [dB]). This second reference clock is further frequency-divided by a 1/6 frequency divider 17b, a 1/8 frequency divider 18b, and a 1/12 frequency divider 19b, resulting in clocks of 22.5792 MHz (63.7 [dB]), 16.9344 MHz (66.2 [dB]), and 11.2896 MHz (69.7 [dB]), respectively, which are associated with the second-frequency clock Fr2. These clocks constitute a second reference frequency series Fr2.

The third PLL circuit 10c is composed of a first frequency divider 11c (division ratio 1/45), a second frequency divider 12c (division ratio 1/96), a PD 13c, an LPF 14c, and a VCO 15c. Although the division ratios are different, this PLL circuit 10c has the same function as the first PLL circuit 10a.

Like the second PLL circuit 10b, the third PLL circuit 10c is also supplied with the clock Fim1 and generates a 147.456 MHz (=69.120×96/45) third-base clock for generating the third reference clock in accord with the division ratios of frequency dividers 11c and 12c.

The output of the first frequency divider 11c, or the first input P1 to the PD 13c, is 87 [dB] (=54+20 log 45), which is not limited by the noise floor. The S/N ratio of the signal input to the second frequency divider 12c, or the S/N ratio of the third-base clock, is 47.4 [dB] (=87−20 log 96).

The third-base clock (147.456 MHz, 47.4 [dB]) is frequency-divided by 4 by the frequency divider 16c, which results in the third reference frequency clock Fr3 (36.864 MHz, 59.4 [dB]). The resultant third reference clock Fr3 is further frequency-divided by a 1/6 frequency divider 17c, a 1/8 frequency divider 18c, and a 1/12 frequency divider 19c to generate clocks of a third reference frequency series Fr3s associated with the third reference frequency clock Fr3. The third reference frequency series includes 24.576 MHz (63.0 [dB]), 18.432 MHz (65.4 [dB]), and 12.288 MHz (69.0 [dB]).

In addition, the first reference frequency clock Fr1 (27 MHz, 80 [dB]), which is supplied to the first PLL circuit 10a as a reference clock, and the clock that results from the reference clock by the frequency division by a 1/2 frequency divider 16d (13.5 MHz, 86 [dB]) are also output as clocks of the first reference frequency series Fr1s.

The clocks of the first reference frequency series Fr1s including the first reference frequency clock Fr1, the clocks of the second reference frequency series Fr2s including the second reference frequency clock Fr2, and clocks of the third reference frequency series Fr3s including the third reference frequency clock Fr3 have sufficiently high S/N ratios as compared with the clock of the cited reference frequency, so that they can be selectively utilized.

It should be appreciated that in the first embodiment shown herein although the first PLL circuit 10a of the first stage has an S/N ratio a little limited by the noise floor, the subsequent PLL circuits, i.e. second PLL circuit 10b and third PLL circuit 10c, are not influenced by the noise floor. That is, the division ratios of the subsequent PLL circuits 10a, 10b, and 10c are set so that the S/N ratios of these PLL circuits are not determined by the S/N ratio of the noise floor. Only the S/N ratio of the first PLL circuit 10a can be limited by the noise floor, since the S/N ratio is dependent on the S/N ratio of the first reference clock Fr1 input to the first PLL circuit 10a. Thus, the S/N ratios of the clock generation system can be most effectively improved.

Figure 2:
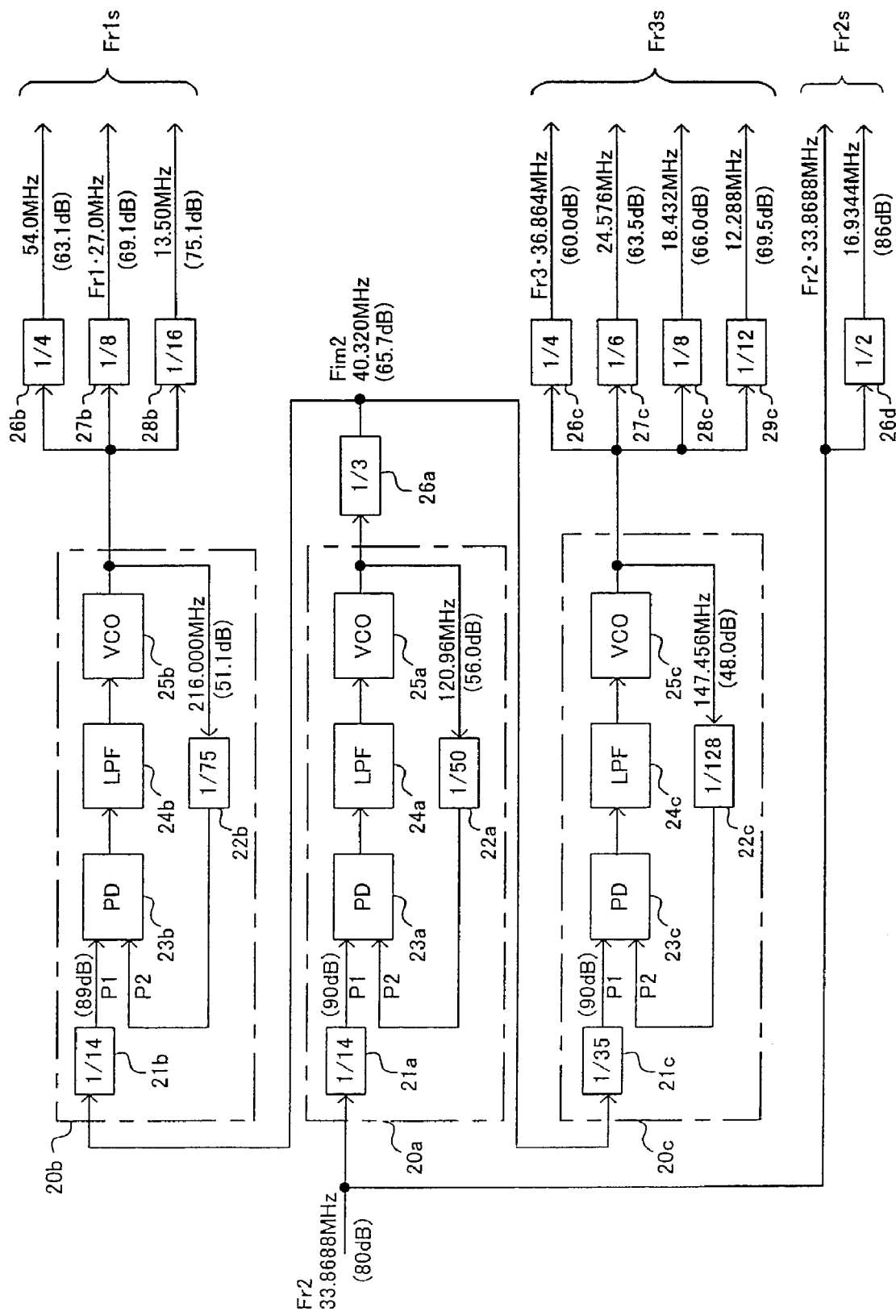
FIG. 2 is a block diagram representation of a second embodiment of a clock generation system according to the invention.

Referring to FIG. 2, there is shown a structure of a clock generation system in accordance with a second embodiment of the invention.

In the clock generation system shown in FIG. 2, the first PLL circuit 20a is supplied with the second reference frequency clock Fr2 (33.8688 MHz). Based on this second reference frequency clock Fr2, clocks of the first reference frequency series Fr1s including the first reference frequency clock Fr1 and clocks of a third reference frequency series Fr3s including a third reference frequency clock Fr3 are generated. Although the first through the third PLL circuits 20a, 20b, and 20c and the respective frequency dividers have different frequencies and division ratios, they are the same in fundamental structure and function as the first embodiment shown in FIG. 1.

The first frequency divider 21a of the first PLL circuit 20a divides the input clock Fr2 by a factor of 14, and supplies the resultant clock to one comparative input P1 of the PD 23. The S/N ratio of this comparison input P1 is theoretically 103 [dB] (=80+20 log 14), which, in actuality however, turns out to be 90 [dB] due to the limitation of the noise floor. The second frequency divider 22a divides the output of the PLL circuit 20a by 50, and supplies the resultant clock to the other comparison input P2 of the PD 23a. The S/N ratio also turns out to be 90 [dB].

The output frequency of the VCO 25a has been converted to 120.96 (=33.8688×50/14) MHz according to the division ratios of the frequency dividers 21a and 22a. The S/N ratio of the output of VCO 25a is 56 [dB] (=90−20 log 50). The output of VCO 25a is again frequency-divided by frequency divider 26a by 3 to obtain a second intermediate-frequency clock Fim2 (40.320MHz). The S/N ratio of the clock Fim2 becomes 65.7 [dB] as a consequence of frequency division by the frequency divider 26a by 3.

This clock Fim2 (40.320 MHz, 65.7 [dB]) is used as a common input clock to the second PLL circuit 20b and the third PLL circuit 20c.

The second PLL circuit 20b is composed of a first frequency divider 21b (division ratio 1/14), a second frequency divider 22b (division ratio 1/75) and PD 23b, LPF 24b, and VCO 25b, and operates in the same way as the first PLL circuit 20a, though its frequency division ratios differ.

This second PLL circuit 20b is supplied with the clock Fim2 to generate a first-base clock of 216 MHz (=40.320× 75/14) according to the division ratios of the frequency dividers 21b and 22b.

The S/N ratio of the output of the first frequency divider 21b, that is, the first input P1 of the PD 23b, is not affected by the noise floor, and is 89 [dB] (=65.7+20 log 14). The S/N ratio at the input of the second frequency divider 22b, that is, the S/N ratio of the first-base clock, becomes 51.1 [dB] (=89−20 log 75).

The first-base clock (216 MHz, 51.1 [dB]) is frequency-divided by a frequency divider 27b by 8, outputting a first reference clock (27 MHz, 69.1 [dB]). The first reference clock is further frequency-divided by a 1/4 frequency divider 26b and a 1/16 frequency divider 28b, outputting clocks of 54 MHz (63.1 [dB]) and 13.5 MHz (75.1 [dB]) clocks, which are associated with the first-frequency clock Fr1. These clocks are outputted as clocks of the first reference frequency series Fr1s.

The third PLL circuit 20c is composed of a first frequency divider 21c (division ratio 1/35), a second frequency divider 22c (division ratio 1/128), a PD 23c, an LPF 24c, and a VCO 25c, and operates in the same way as the first PLL circuit 20a, though its frequency division ratios differ.

Like the second PLL circuit 20b, the third PLL circuit 20c is supplied with the clock Fim2 to generate a third-base clock of 147.456 MHz (=40.320×128/35) according to the division ratios of the frequency dividers 21c and 22c.

The S/N ratio of the first frequency divider 21c, that is, the S/N ratio of the first input P1 of the PD 23c, is theoretically 96.6 [dB] (=65.7+20 log 35). In actuality, however, it is limited to 90 [dB] by the noise floor. The S/N ratio of the input to the second frequency divider 22c, or the S/N ratio of the third-base clock, is 48.0 [dB] (=90−20 log 128).

The third-base clock (147.456 MHz, 48.0 [dB]) is frequency-divided by a frequency divider 26c by 4 to output a third reference frequency clock Fr3 (36.864 MHz, 60.0 [dB]). In addition, the third reference clock is further frequency-divided by a 1/6 frequency divider 27c, a 1/8 frequency divider 28c, and a 1/12 frequency divider 29c to generate clocks having frequencies of 24.576 MHz (63.5 [dB]), 18.432 MHz (66.0 [dB]), and 12.288 MHz (69.5 [dB]) belonging to a third reference frequency series Fr3s associated with the third reference frequency clock Fr3.

Further, the second reference frequency clock Fr2 (33.8688 MHz, 80 [dB]) and a clock of 16.9344 MHz (86 [dB]) that is obtained by frequency-dividing the second reference frequency clock Fr2 by the frequency divider 26d by 2 are output, constituting the clocks of a second reference frequency series Fr2s.

The clocks of the first through the third reference frequency series Fr1s–Fr3s have little influence of the noise floor and have much higher S/N ratios as compared with the clock of cited reference, though they are partially limited by the noise floor.

Figure 3:
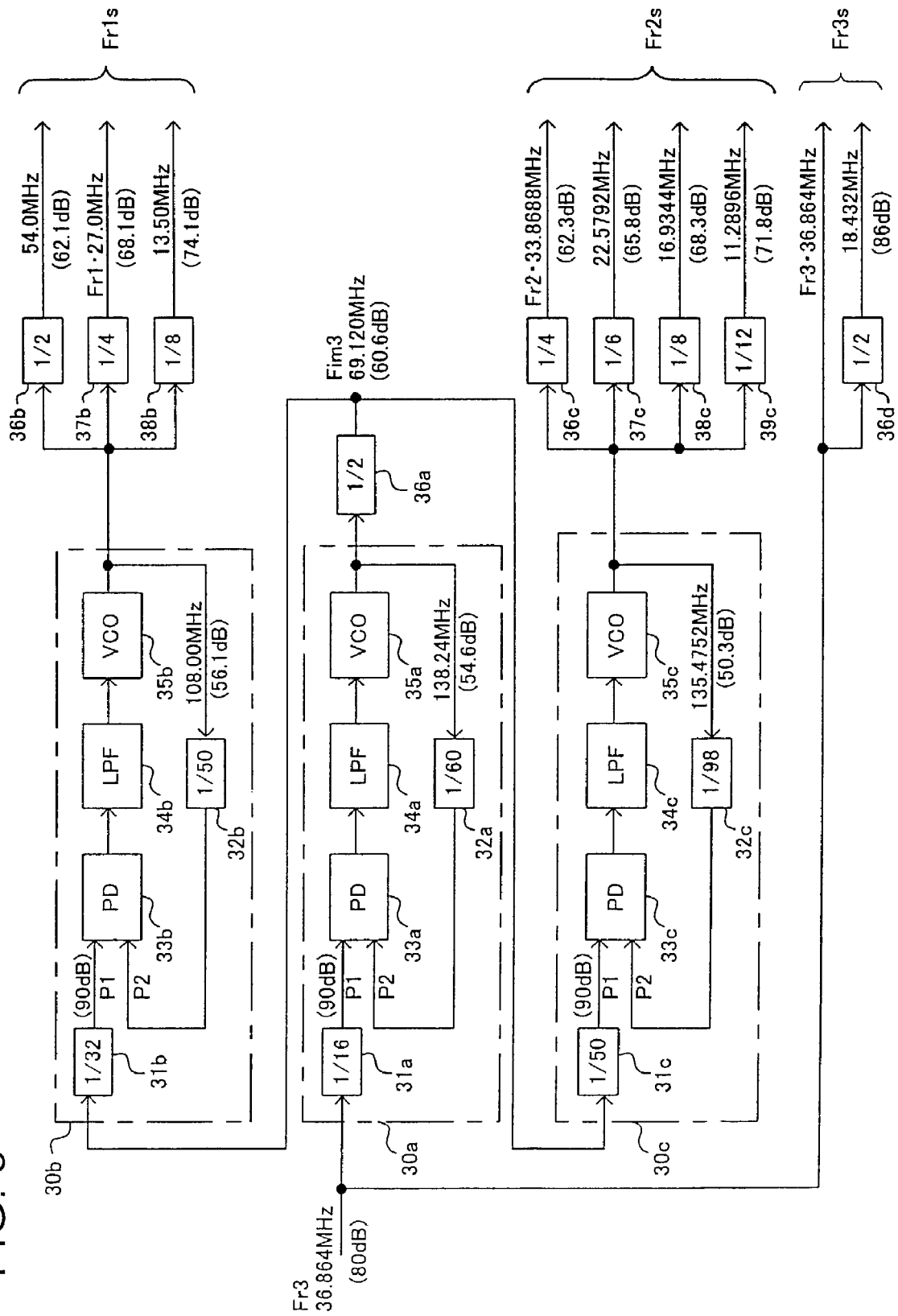
FIG. 3 is a block diagram representation of a third embodiment of a clock generation system according to the invention.

Referring to FIG. 3, there is shown a structure of a clock generation system in accordance with the third embodiment of the invention. The clock generation system shown in FIG. 3 receives as its reference clock a 36.864 MHz third reference frequency clock for sound system (especially for DVD) and outputs clocks of the first 27 MHz reference frequency series for video system and clocks of a second 33.8688 MHz reference frequency series for audio system (especially for CD).

In this clock generation system of FIG. 3 the third reference frequency clock Fr3 (36.864 MHz) is supplied to the first PLL circuit 30a. Based on the third reference frequency clock Fr3, clocks of a first reference frequency series Fr1s that includes the first reference frequency clock Fr1 and clocks of a second reference frequency series Fr2s that includes the second reference frequency clock Fr2 are generated. It is noted that the first through third PLL circuits 30a, 30b, and 30c and the frequency dividers included in this embodiments are basically the same in structure and functions as those of FIG. 1, except for the frequencies it generates and the frequency division ratios used.

In the first PLL circuit 30a, a first frequency divider 31a frequency-divides the input clock Fr3 by 16, and supplies it as one comparison input P1 to a PD 33a. The S/N ratio of the comparison input P1 is theoretically 104 [dB] (=80+20 log 16), but in actuality it is reduced to 90 [dB] by the limitation of the noise floor. A second 1/60 frequency divider 32a frequency-divides the output of the PLL circuit 30a by 60 and provides the resultant clock as the other comparison input P2 to the PD 33a. The S/N ratio of the comparison input P2 is also 90 [dB].

The frequency outputted from a VCO 35a is converted to 138.24 (=36.864×60/16) MHz according to the division ratios of the frequency dividers 31a and 32a. The S/N ratio of the output of the VCO 35a is 54.6 [dB] (=90−20 log 60). The frequency of the output of the VCO 35a is further divided by 2 by a frequency divider 36a to obtain a third intermediate-frequency clock Fim3 (69.120 MHz). The S/N ratio of the clock Fim3 becomes 60.6 [dB] after the frequency division by a factor of 3 by the frequency divider 36a.

This clock Fim3 (69.120 MHz, 60.6 [dB]) is used as the common input clock to the second and third PLL circuits 30b and 30c, respectively.

The second PLL circuit 30b is composed of a first frequency divider 31b (frequency division ratio of 1/32), a second frequency divider 32b (frequency division ratio of 1/50) and a PD 33b, an LPF 34b, and a VCO 35b, and have different frequency division ratios from the first PLL circuit 30a. However, the two PLL circuits are the same in operation.

The second PLL circuit 30b is fed the clock Fim3, and outputs a first-base clock of 108 (=69.120×50/32) MHz in accordance with the division ratio of the frequency dividers 31b and 32b.

Although the S/N ratio of the output of the first frequency divider 31b is theoretically 90.6 [dB] (=60.6+20 log 32), it is limited to 90 [dB] by the noise floor. The S/N ratio at the input end of the frequency divider 32b, i.e. the S/N ratio of the first-base clock becomes 56.1 [dB] (=90−20 log 50).

This first-base frequency clock (108 MHz, 56.1 [dB]) is frequency-divided by a frequency divider 37b by 4 to output a first reference frequency clock Fr1 (27 MHz, 68.1 [dB]). In addition, the first reference frequency clock is further frequency-divided by a 1/2 frequency divider 36b and a 1/8 frequency divider 38b, resulting in clocks having frequencies of 54 MHz (62.1 [dB]) and 13.5 MHz (74.1 [dB]) belonging to a first reference frequency series Fr1s associated with the first reference frequency clock Fr1.

The third PLL circuit 30c is composed of a first frequency divider 31c (division ratio of 1/50), a second frequency divider 32c (division ratio of 1/98), a PD 33c, an LPF 34c, and a VCO 35c, and have division ratios different from those of the first PLL circuit 30a. However, the PLL circuit 30c operates in the same manner as the PLL circuit 30a.

Like the second PLL circuit 30b, the third PLL circuit 30c is fed the clock Fim3 to generates a second-base clock of 135.4752 (=69.120×98/50) MHz clock in accordance with the division ratios of the frequency dividers 31c and 32c.

The S/N ratio of the output of the first frequency divider 31c, i.e. the S/N ratio of the first input P1 to the PD 33c, is theoretically 94.5 [dB] (=60.6+20log50), it is in actuality 90 [dB] as it is limited by the noise floor. The S/N ratio at the input end of the second frequency divider 32c, i.e. the S/N ratio the second-base clock becomes 50.3 [dB] (=90−20 log 98).

The second-base clock (135.4752 MHz, 50.3 [dB]) is further frequency-divided by a 1/4 frequency divider 36c by 4 to generate a second reference frequency clock Fr2 (33.8688 MHz, 62.3 [dB]). In addition, the frequency of the second reference clock is further frequency-divided by a 1/6 frequency divider 37c, a 1/8 frequency divider 38c, and a 1/12 frequency divider 39c into frequencies of 22.5792 MHz (65.8 [dB]), 16.9344 MHz (68.3 [dB]), and 11.2896 MHz (71.8 [dB]), respectively. These frequencies constitute a second reference frequency series Fr2 specifically associated with the second reference clock Fr2.

In addition, the third reference frequency clock Fr3 (36.864 MHz, 80 [dB]) supplied to the first PLL circuit 30a as the reference clock thereof is further frequency-divided by 2 by a frequency divider 36d to generate 18.432 MHz (86 [dB]) clock, which is output together with the third reference frequency clock Fr3 to form the clocks of a third reference frequency series Fr3s.

The clocks of the first through the third reference frequency series Fr1s–Fr3s have little influence of the noise floor and have much higher S/N ratios as compared with clocks of cited reference, though their S/N ratios are partially limited by the noise floor.

It will be understood that the frequency dividers 16a, 26a and 36a used in the foregoing embodiments to generate the intermediate-frequency clocks Fim1–Fim3 may be omitted by adapting other frequency dividers in other PLL circuits to generates these intermediate clocks.

Figure 4:
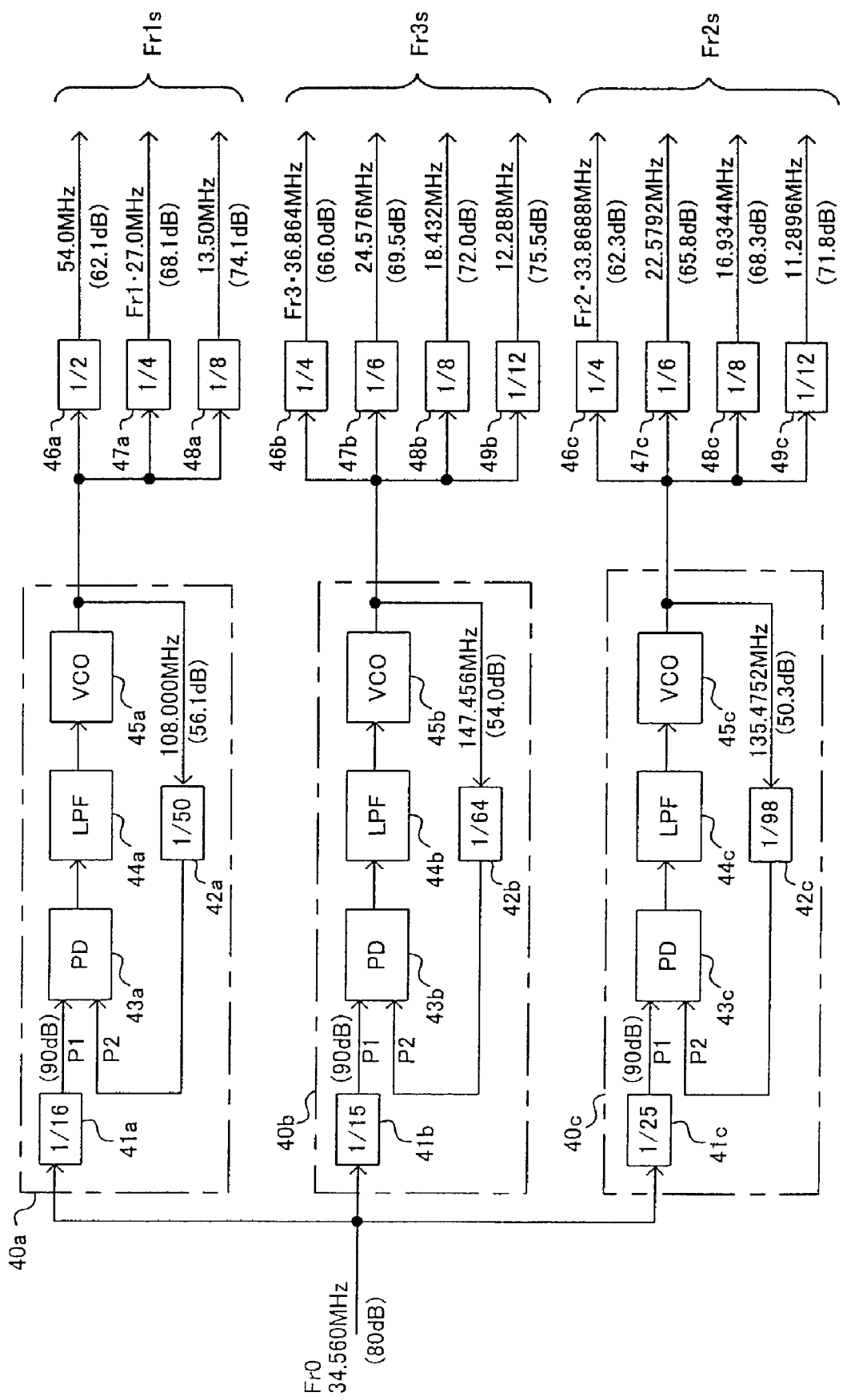
FIG. 4 is a block diagram representation of a fourth embodiment of a clock generation system according to the invention.

Referring to FIG. 4, there is shown a configuration of a clock generation system in accordance with the fourth embodiment of the invention.

In the clock generation system shown in FIG. 4, besides the first through the third reference frequency clocks Fr1–Fr3, use is made of another reference clock Fr0 suitable for forming the respective reference frequencies.

The reference clock Fr0 (34.560 MHz, 80 [dB]) is supplied to a first PLL circuit 40a, a second PLL circuit 40b, and a third PLL circuit 40c.

The first PLL circuit 40a has a first frequency divider 41a having a frequency division ratio of 1/16 and a second frequency divider 42a having a frequency division ratio of 1/50, outputting a first-base clock of 108 MHz (56.1 [dB]). The first-base clock is frequency-divided by a frequency dividers 46a, 47a, and 48a having frequency division ratios 1/2, 1/4, and 1/8, respectively, to generate clocks of 54 MHz (62.1 [dB]), 27 MHz (68.1 [dB]), and 13.5 MHz (74.1 [dB]), respectively. These frequencies constitute a first reference frequency series Fr1s.

The second PLL circuit 40b has a first frequency divider 41b and a second frequency divider 42b having frequency division ratios 1/15 and 1/64, respectively, to generate a third-base clock of 147.456 MHz (54.0 [dB]). The frequency of this third-base clock is frequency-divided by four frequency dividers 46b, 47b, 48b, and 49b having a frequency division ratios 1/4, 1/6, 1/8, and 1/12, respectively, to obtain a third reference frequency series Fr3s that include frequencies of 36.864 MHz (66.0 [dB]), 24.576 MHz (69.5 [dB]), 18.432 MHz (72.0 [dB]), and 12.288 MHz (75.5 [dB]), respectively.

The third PLL circuit 40c has a first frequency divider 41c and a second-base divider 42c having frequency division ratios 1/25 and 1/98, respectively, to generates a second reference clock (135.4752 MHz, 50.3 [dB]). The second-base clock is frequency-divided by frequency dividers 46c, 47c, 48c, and 49c having frequency division ratios of 1/4, 1/6, 1/8, and 1/12, respectively, to generate clocks having frequencies of 33.8688 MHz (62.3 [dB]), 22.5792 MHz (66.8 [dB]), 16.9344 MHz (68.3 [dB]), and 11.2896 MHz (71.8 [dB]). These frequencies constitute a second reference frequency series Fr2s. Reference numerals 43a–43c stand for PDs, 44a–44c for LPFs, and 45a–45c for VCOs.

It will be apparent, in comparison with the example of FIG. 7, that each of the clocks of the first through the third reference frequency series Fr1s–Fr3s of the embodiment shown in FIG. 4 have sufficiently large S/N ratios (over 60 dB), which are adequate for use as system clocks. This has been achieved by the use of an appropriate common reference clock Fr0 (34.560 MHz) to form the first through the third reference frequency series Fr1s–Fr3s, and by selection of appropriate division ratios of the respective PLL circuits 40a–40c to eliminate the limitation or suppress the influence of the noise floor.

Figure 5:
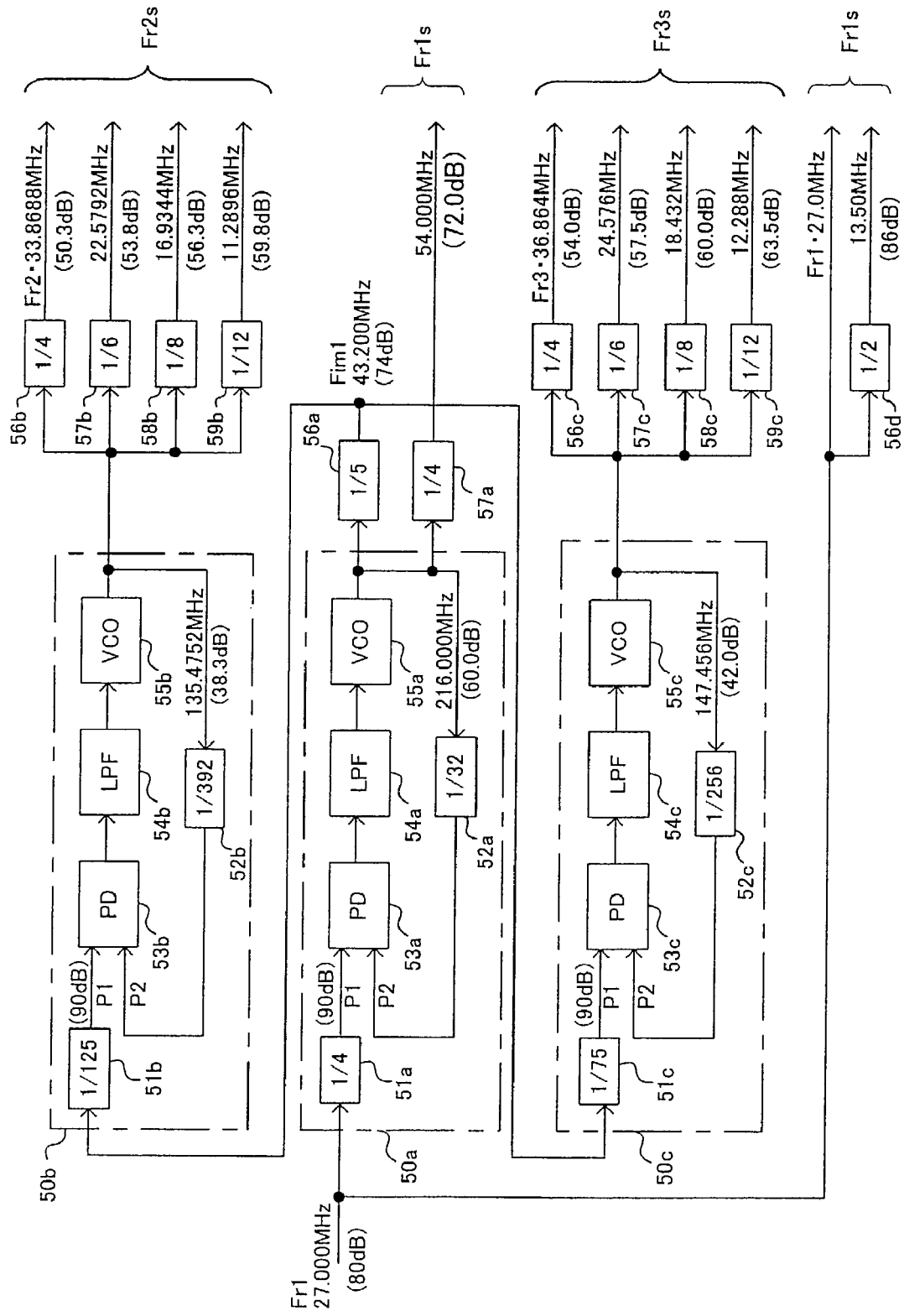
FIG. 5 is a block diagram representation of a fifth embodiment of a clock generation system according to the invention.

Referring to FIG. 5, there is shown a structure of a clock generation system in accordance with the fifth embodiment of the invention. As shown in FIG. 5, the system receives a 27 MHz clock as a first reference frequency clock and generates clocks of a 27 MHz series (first reference frequency series) for video system, clocks of a 33.8688 MHz series (second reference frequency series) for audio system (especially for CD), and clocks of a 36.864 MHz series (third reference frequency series) for audio system (especially for DVD). In this regard, this clock generation system is the same as the first embodiment shown in FIG. 1. Since a high-quality quartz oscillator having a frequency of 27 MHz is available on the market at low price, the clock generation system that receives a 27 MHz clock as the first reference frequency clock is advantageous.

However, the clock generation system in the form of the first embodiment shown in FIG. 1 cannot make the 54 MHz frequency clock for video system from the first 27 MHz reference frequency clock. Moreover, although the 54 MHz frequency clock for video requires the highest S/N ratio, any of the clock generation systems shown in FIGS. 2–4 is not necessarily adequate to provide a sufficiently high S/N ratio.

The clock generation system of FIG. 5 can provide the 54 MHz first reference frequency clock for video with a sufficiently high S/N ratio, using the reference clock of 27 MHz as the reference frequency clock.

In the clock generation system of FIG. 5, the first reference frequency clock Fr1 (27.0 MHz) is provided to a first PLL circuit 50a. Based on this first reference frequency clock Fr1, the clock generation system generates clocks of a first reference frequency series Fr1s (54 MHz series) including the first reference frequency clock Fr1, clocks of a second reference frequency series Fr2s including the second reference frequency clock Fr2, clocks of a third reference frequency series Fr3s including the third reference frequency clock Fr3.

Although the first through the third PLL circuits 50a, 50b, and 50c and the respective frequency dividers have different frequencies and division ratios from those of the first embodiment shown in FIG. 1, they are the same in fundamental structure and function as the first embodiment.

In the first PLL circuit 50a, the first frequency divider 51a frequency-divides the input clock Fr1 by 4 to generate one comparison input P1 to the PD 53a. The S/N ratio of the comparison input P1 is theoretically 92 [dB] (=80+20 log 4). However, in actuality it is limited to 90 [dB] by the noise floor. The second frequency divider 52a frequency-divides the output of the PLL circuit 50a by 32 to generate the other comparison input P2 of the PD 53a. The S/N ratio of the comparison input P2 is also 90 [dB].

The frequency of the output of the VCO 55a is converted to 216.0 (=27.0×32/4) MHz in accordance with the division ratios of frequency dividers 51a and 52a. The S/N ratio of the output of the VCO 55a is 60 [dB] (=90–20 log 32). The output of the VCO 55a is further frequency-divided by a frequency divider 56a by 5 to obtain a fifth intermediate-frequency clock Fim5 (43.2 MHz). The S/N ratio of this clock Fim5 is 74.0 [dB] after the frequency division by the frequency divider 56a.

The clock Fim5 is used as a common input clock to the second PLL circuit 50b and the third PLL circuit 50c.

In addition, the output of VCO 55a is further frequency-divided by another frequency divider 57a by 4 to obtain a 54 MHz clock for video. The S/N ratio of the 54 MHz frequency clock is 72.0 [dB] after the frequency division by the frequency divider 57a. It should be appreciated that this S/N ratio is much larger as compared with the S/N ratios (about 60 [dB]) obtained in other embodiments shown in FIGS. 2–4.

The second PLL circuit 50b is composed of a first frequency divider 51b (frequency division ratio of 1/125), a second frequency divider 52b (frequency division ratio of 1/392), a PD 53b, an LPF 54b, and a VCO 55b. Although the division ratios are different, operations of the second PLL circuit 50b are the same as those of the first PLL circuit 50a.

The second PLL circuit 50b is supplied with a clock Fim5 and generates a second-base clock of 135.4752 MHz (=43.20×392/125) in accordance with the frequency division ratios of the frequency dividers 51b and 52b.

Although the theoretical S/N ratio of the first frequency divider 51b, i.e. the S/N ratio of the first input P1 of the PD 53b, is 114.3 [dB] (=74.0+20 log 125), it is in actuality 90 [dB] due to the limitation by the noise floor. The S/N ratio of the input signal to the second frequency divider 52b, i.e. the S/N ratio of the first-base clock, is 38.3 [dB] (=90−20 log 392).

This second-base clock (135.4752 MHz, 38.3 [dB]) is further frequency-divided by a frequency divider 56b by 4, outputting a second reference frequency clock Fr2 (33.8688 MHz, 50.3 [dB]). In addition, the second reference clock is further frequency-divided by a 1/6 frequency divider 57b, a 1/8 frequency divider 58b, and a 1/12 frequency divider 59b, generating clocks of 22.5792 MHz (53.8 [dB]), 16.9344 MHz (56.3 [dB]), and 11.2896 MHz (59.8 [dB]) belonging to a second reference frequency series Fr2s associated with the second reference frequency clock Fr2.

The third PLL circuit 50c is composed of a first frequency divider 51c (frequency division ratio of 1/75), a second frequency divider 52c (frequency division ratio of 1/256), a PD 53c, a LPF 54c, and a VCO 55c. Although the division ratios are different, the third PLL circuit 50c operates in the same manner as the first PLL circuit 50a.

As in the second PLL circuit 50b, this third PLL circuit 50c is supplied with the clock Fim5, and generates a third-base clock of 147.456 MHz (=43.200×256/75) in accordance with the division ratios of the frequency dividers 51c and 52c.

The S/N ratio of the output of the first frequency divider 51c, i.e. the S/N ratio of the first input P1 of the PD 53c, is theoretically 111.5 [dB] (=74.0+20 log 75), it is in actuality limited to 90 [dB] by the noise floor. The S/N ratio of the input signal to the second frequency divider 52c, i.e. the S/N ratio of the third-base clock, is 42.0 [dB] (=90−20 log 256).

This third-base clock (147.456 MHz, 42.0 [dB]) is further frequency-divided by a frequency divider 56c by 4, outputting a third reference frequency clock Fr3 (36.864 MHz, 54.0 [dB]). In addition, the third reference clock is further frequency-divided by a 1/6 frequency divider 57c, a 1/8 frequency divider 58c, and a 1/12 frequency divider 59c, to generate clocks of 24.576 MHz (57.5 [dB]), 18.432 MHz (60.0 [dB]), and 12.288 MHz (63.5 [dB]) belonging to a third reference frequency series Fr3s associated with the second reference frequency clock Fr3.

In addition, the first reference frequency clock Fr1 (27 MHz, 80 [dB]), which is supplied to the first PLL circuit 50a as a reference clock, and the clock that results from the frequency division of the reference clock by a 1/2 frequency divider 56d (13.5 MHz, 86 [dB]) are also output as clocks of the first reference frequency series Fr1s. The 54 MHz clock outputted from the frequency divider 57a also belongs to the clocks of the first reference frequency series Fr1s.

It is noted that the frequency divider 56a generating the intermediate-frequency clock Fim5 may be omitted by adapting the frequency dividers 51b and 51c of other PLL circuit to generate the clock Fim5.

The clocks of the first through the third reference frequency series Fr1s–Fr3s are far less influenced by the noise floor, though they are partially limited by the noise floor, so that they have sufficiently high S/N ratios as compared with the cited reference frequency. The clock generation system of FIG. 5 provides a 54 MHz clock having a sufficiently high S/N ratio together with the first reference frequency clock of 27 MHz.

FIG. 6 shows in tabulated form clocks and their S/N ratios belonging to the respective frequency series as described in the first through the fifth embodiments, along with a reference. Entries in the table denoted as "NO OUTPUT" indicate cases where a clock cannot be output. Entries in the table denoted as "NO OUTPUT*" indicate cases where a clock with a duty ratio of 50% cannot be output, but can be output with other duty ratios, for example a duty ratio of 66%.

What we claim is:

1. A clock generation system for generating at least a first frequency clock having a first frequency, a second frequency clock having second frequency, and a third-frequency clock having a third frequency, said clock generation system comprising:
   a first PLL circuit supplied with said first-frequency clock as a reference clock and adapted to generate an intermediate-frequency clock having an intermediate frequency having a predetermined first ratio to said reference frequency;
   a second PLL circuit supplied with said intermediate-frequency clock and adapted to generate said second-frequency clock, with said second frequency having a predetermined second ratio to said intermediate frequency; and
   a third PLL circuit supplied with said intermediate-frequency clock and adapted to generate said third-frequency clock, with said third frequency having a predetermined third ratio to said intermediate frequency,
   wherein said second-frequency clock is obtained by frequency dividing the clock outputted from said second PLL circuit; and
   said third-frequency clock is obtained by frequency dividing the clock outputted from said third PLL circuit, and
   wherein the frequencies of said first-, second-, and third-frequency clocks are 27 MHz, 33.8688 MHz, and 36.864 MHz, respectively.

2. A clock generation system for generating at least a first frequency clock having a first frequency, a second frequency clock having a second frequency, and a third-frequency clock havin a third frequency, said clock generation system comprising:
   a first PLL circuit supplied with said first-frequency clock as a reference clock and adapted to generate an intermediate-frequency clock having an intermediate frequency having a predetermined first ratio to said reference frequency;
   a second PLL circuit supplied with said intermediate-frequency clock and adapted to generate said second-frequency clock, with said second frequency having a predetermined second ratio to said intermediate frequency; and
   a third PLL circuit supplied with said intermediate-frequency clock and adapted to generate said third-frequency clock, with said third frequency having a predetermined third ratio to said intermediate frequency,
   wherein said second-frequency clock is obtained by frequency dividing the clock outputted from said second PLL circuit; and
   said third-frequency clock is obtained by frequency dividing the clock outputted from said third PLL circuit, and
   wherein the frequencies of said first-, second-, and third-frequency clocks are 33.8688 MHz, 27 MHz, and 36.864 MHz, respectively.

3. A clock generation system for generating at least a first frequency clock having a first frequency, a second frequency clock having a second frequency, and a third-frequency clock having a third frequency, said clock generation system comprising:

a first PLL circuit supplied with said first-frequency clock as a reference clock and adapted to generate an intermediate-frequency clock having an intermediate frequency having predetermined first ratio to said reference frequency;

a second PLL circuit supplied with said intermediate-frequency clock and adapted generate said second-frequency clock, with said second frequency having a predetermined second ratio to said intermediate frequency; and a third PLL circuit supplied with said intermediate-frequency clock and adapted to generate said third-frequency clock, with said third frequency having a predetermined third ratio to said intermediate frequency, wherein said second-frequency clock is obtained by frequency dividing the clock outputted from said second PLL circuit; and said third-frequency clock is obtained by frequency dividing the clock outputted from said third PLL circuit, and wherein the frequencies of said first-, second-, and third-frequency clocks are 36.864 MHz, 27 MHz, and 33.8688 MHz, respectively.

4. A clock generation system, for generating at least a first-frequency clock having a first frequency, a second-frequency clock having a second frequency, and a third-frequency clock having a third frequency, said clock generation system comprising:

a first PLL circuit supplied with said first-frequency clock as a reference clock and adapted to generate an intermediate-frequency clock having an intermediate frequency having a predetermined first ratio to said reference frequency;

a second PLL circuit supplied with said intermediate-frequency clock and adapted to generate said second-frequency clock, with said second frequency having a predetermined second ratio to said intermediate frequency;

a third PLL circuit supplied with said intermediate frequency clock and adapted to generate said third-frequency clock, with said third frequency having a predetermined third ratio to said intermediate frequency;

at least one frequency divider to frequency-divide said first-frequency clock by a predetermined factor, wherein said first-frequency clock and the output of said at least one frequency divider are outputted as clocks of a first frequency series;

a first multiplicity of frequency dividers having different frequency division ratios to frequency divide the clock outputted from said second PLL circuit, wherein said first multiplicity of frequency dividers are adapted to output clocks having frequencies belonging to a second frequency series that includes said second frequency and frequencies having predetermined ratios to said second frequency; and a second multiplicity of frequency dividers having different frequency division ratios to frequency divide the clock outputted from said third PLL circuit, wherein said second multiplicity of frequency dividers are adapted to output clocks having frequencies belonging to a third frequency series that includes said third frequency and frequencies having predetermined ratios to said third frequency.

5. The clock generation system according to claim 4, wherein the frequencies of said first-, second-, and third-frequency clocks are 27 MHz, 33.8688 MHz, and 36.864 MHz, respectively.

6. The clock generation system according to claim 4, wherein, the frequencies of said first-, second-, and third-frequency clocks are 33.8688 MHz, 27 MHz, and 36.864 MHz, respectively.

7. The clock generation system according to claim 4, wherein, the frequencies of said first-, second-, and third-frequency clocks are 36.864 MHz, 27 MHz, and 33.8688 MHz, respectively.

8. A clock generation system for generating at least a first-frequency clock having a first frequency, a second-frequency clock having a second frequency, a third-frequency clock having a third frequency, and a fourth-frequency clock having a frequency that is double of said first frequency, said clock generation system comprising:

a first PLL circuit supplied with said first-frequency clock as a reference clock and adapted to generate an intermediate-frequency clock having an intermediate frequency having a predetermined first ratio to said reference frequency;

a frequency divider for generating said fourth-frequency clock by frequency-dividing the output of said first PLL circuit by a predetermined factor;

a second PLL circuit supplied with said intermediate-frequency clock and adapted to generate said second-frequency clock, with said second frequency having a predetermined second ratio to said intermediate frequency; and a third PLL circuit supplied with said intermediate-frequency clock and adapted to generate said third-frequency clock, with said third frequency having a predetermined third ratio to said intermediate frequency.

9. The clock generation system according to claim 8, the frequencies of said first-, second-, third-, and fourth-frequency clocks are 27 MHz, 33.8688 MHz, 36.864 MHz, and 54 MHz, respectively.

10. The clock generation system according to claim 8, further comprising:

at least one frequency divider to frequency-divide said first-frequency clock, wherein said first-frequency clock, said fourth frequency clock, and the output of said at least one frequency divider are outputted as clocks of a first frequency series;

a first multiplicity of frequency dividers having different frequency division ratios to frequency-divide the clock outputted from said second PLL circuit, wherein said first multiplicity of frequency dividers are adapted to output clocks having frequencies belonging to a second frequency series that includes said second frequency and frequencies having predetermined ratios to said second frequency; and a second multiplicity of frequency dividers having different frequency division ratios to frequency-divide the clock outputted from said third PLL circuit, wherein said second multiplicity of frequency dividers are adapted to output clocks having frequencies belonging to a third frequency series that includes said third frequency and frequencies having predetermined ratios to said third frequency.

11. The clock generation system according to claim 10, the frequencies of said first-, second-, third-, and fourth-frequency clocks are 27 MHz, 33.8688 MHz, 36.864 MHz, and 54 MHz, respectively.

* * * * *